United States Patent [19]

Jinnouchi et al.

[11] Patent Number: 5,575,854

[45] Date of Patent: Nov. 19, 1996

[54] SEMICONDUCTOR TREATMENT APPARATUS

[75] Inventors: Shimpei Jinnouchi, Nirasaki; Hiroshi Kuno, Komae; Hiroshi Otsuki, Tokyo, all of Japan

[73] Assignees: Tokyo Electron Limited; Kabushiki Kaisha Saginomiya Seisakusho, both of Tokyo, Japan

[21] Appl. No.: 366,452

[22] Filed: Dec. 30, 1994

[30] Foreign Application Priority Data

Dec. 30, 1993 [JP] Japan .................................. 5-351865

[51] Int. Cl.$^6$ ............................................ C23C 26/00
[52] U.S. Cl. ............................................ 118/715; 118/726
[58] Field of Search ................................ 118/667, 688, 118/708, 712, 715, 726

[56] References Cited

U.S. PATENT DOCUMENTS

5,288,325  2/1994  Goimi ........................................ 118/692
5,419,924  5/1995  Nagashima et al. .................... 427/248.1
5,431,736  7/1995  Boer ........................................... 118/726

Primary Examiner—R. Bruce Breneman
Assistant Examiner—Felisa Garrett
Attorney, Agent, or Firm—Oblon, Spivak, McClelland, Maier & Neustadt, P.C.

[57] ABSTRACT

A CVD apparatus in which a process gas containing a carrier gas and a raw material gas is supplied to a process chamber through a supply line. A first part of the carrier gas is supplied from a primary line through a bubbling line and passed through a raw material liquid to derive the raw material gas, and then sent to the supply line. A second part of the carrier gas is supplied from the primary line through a bypass line directly to the supply line. Electromagnetic valves are provided on each of the bubbling line and the bypass line and flow sensors are provided on each of the primary line and the supply line. Each flow sensor has a reference element and a heated element, each of which has a thermally-sensitive and electrically conductive wire. Signals from the sensors are supplied to a flow controller, which measures the flow rate of the raw material gas by comparing the measured value with a reference value, and adjusts the opening degrees of the electromagnetic valves on the basis of the comparison.

18 Claims, 3 Drawing Sheets

SEMICONDUCTOR TREATMENT APPARATUS

BACKGROUND OF THE INVENTION

1. Field of the Invention

This invention relates to a semiconductor treatment apparatus, and more particularly to a treatment apparatus for supplying a process chamber with a process gas formed of a mixture of a carrier gas and a raw material gas.

2. Description of the Related Art

In semiconductor treatment apparatuses such as a thermal treatment apparatus, a diffusion apparatus, and a CVD apparatus, a process gas formed of a mixture of a carrier gas and a raw material gas is supplied into a process chamber to treat a semiconductor wafer or an LCD substrate. In the case of the CVD apparatus, for example, a silicon-base compound such as tetraethylorthosilicate (TEOS), or an organic metal compound such as triisobutylauminium are used as the raw material gas in many cases.

The raw material gas is reserved in a reservoir generally in the form of liquid as a raw material liquid. The raw material liquid is bubbled with the use of the carrier gas to be vaporized. The reservoir is located in a constant-temperature bath. The process gas formed of a mixture thus obtained is transferred through a supply line into a process chamber. The flow of the process gas is controlled by a mass flow controller while it is transferred therethrough. To prevent a raw material gas from being liquefied during the transfer, the supply line is covered with a heating member such as a heating tape.

The mass flow controller has a bypass pipe branching from a main pipe connected to the supply line. Part of the process gas flowing through the bypass line is heated, and the flow of the entire gas mixture is measured on the basis of the movement of heat. However, the bypass pipe has a very small inner diameter, for example, of 1 mm or less, and hence can easily be choked while such a gas is passed therethrough. Therefore, measuring errors are apt to occur and the flow control of the process gas cannot be performed with accuracy.

It is considered that the bypass pipe is choked with by-products resulting from liquefaction of the raw material gas or decomposition of the raw material gas heated in the pipe.

SUMMARY OF THE INVENTION

It is an object of the invention to provide a semiconductor treatment apparatus capable of accurately and reliably controlling the flow of a process gas supplied to a process chamber.

According to a first aspect of the invention, there is provided an apparatus for treating a substrate while supplying a process chamber with a process gas including first and second gases, comprising: the process chamber; a support member arranged in the process chamber for supporting the substrate; a supply line for supplying the process gas into the process chamber; a tank for containing a raw material liquid, from which the second gas is derived, and having a vapor space defined therein above the raw material liquid, the supply line being connected to the tank such that it communicates with the vapor space; a primary line for supplying the first gas to the supply line, at least part of the first gas being passed through the raw material liquid in the tank in the form of bubble, thereby to derive the second gas from the raw material liquid and send the second gas to the supply line through the vapor space; a first flow sensor provided on the primary line and comprising a first heated element, the first heated element having a thermally-sensitive and electrically conductive wire, whose resistance varies in accordance with a variation in temperature; a second flow sensor provided on the supply line and comprising a second heated element, the second heated element having a thermally-sensitive and electrically conductive wire, whose resistance varies in accordance with a variation in temperature; and a flow controller connected to the first and second flow sensors for controlling a flow rate of the second gas contained in the process gas, the flow controller generating a first electric signal representing a flow rate of the first gas on the basis of a variation in the resistance of the thermally-sensitive and electrically conductive wire of the first heated element, also generating a second electric signal representing a flow rate of the process gas on the basis of a variation in the resistance of the thermally-sensitive and electrically conductive wire of the second heated element, and calculating a mesured value of the flow rate of the second gas on the basis of the difference between the first and second electric signals.

According to a second aspect of the invention, there is provided an apparatus for treating a substrate while supplying a process chamber with a process gas including first and second gases, comprising: the process chamber; a support member arranged in the process chamber for supporting the substrate; a supply line for supplying the process gas into the process chamber; a delivery line for sending a first part of the first gas and the second gas to the supply line; a bypass line for sending a second part of the first gas to the supply line; a tank for containing a raw material liquid, from which the second gas is derived, and having a vapor space defined therein above the raw material liquid, the delivery line being connected to the tank such that it communicates with the vapor space; a bubbling line for sending the first part of the first gas into the raw material liquid in the tank, the first part of the first gas being passed through the raw material liquid in the form of bubbles, thereby to derive the second gas from the raw material liquid and send the second gas to the delivery line through the vapor space; first and second electromagnetic valves provided on the bubbling line and the bypass line, respectively; a primary line for supplying the first and second parts of the first gas to the bubbling line and the bypass line, respectively; a first flow sensor provided on the primary line and comprising a first heated element, the first heated element having a thermally-sensitive and electrically conductive wire, whose resistance varies in accordance with a variation in temperature; a second flow sensor provided on the supply line comprising a second heated element, the second heated element having a thermallysensitive and electrically conductive wire, whose resistance varies in accordance with a variation in temperature; and a flow controller, connected to the first and second flow sensors and the first and second electromagnetic valves, for controlling a flow rate of the second gas contained in the process gas, the flow controller generating a first electric signal representing a flow rate of the first gas on the basis of a variation in the resistance of the thermally-sensitive and electrically conductive wire of the first heated element, also generating a second electric signal representing a flow rate of the process gas on the basis of a variation in the resistance of the thermally-sensitive and electrically conductive wire of the second heated element, calculating a measured value of the flow rate of the second gas on the basis of the difference between the first and second electric signals, comparing the measured value with a preset reference value, and adjusting the opening degrees of the first and second electromagnetic valves to change the ratio of the first part of the first gas to the second part of the same on the basis of the comparison.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENT

Figure 1:
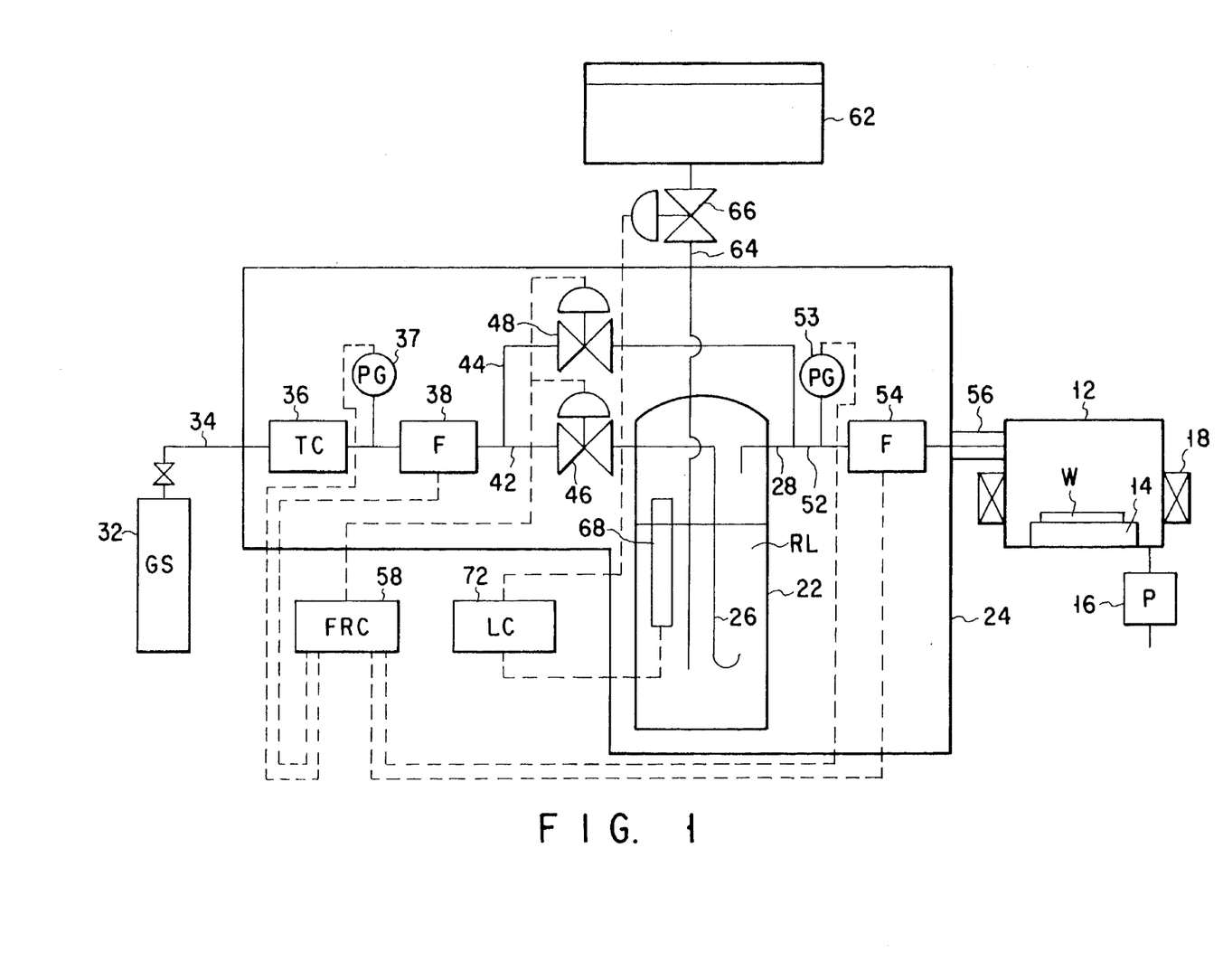
FIG. 1 is a diagram, showing a CVD apparatus according to an embodiment of the invention.

A CVD apparatus shown in FIG. 1 and according to an embodiment of the invention is used to form a silicon oxide film on a semiconductor wafer. Tetraethylorthosilicate (TEOS: $Si(OC_2H_5)_4$), for example, is used as a raw material gas. This gas is mixed with nitrogen gas to constitute a process gas, which is supplied into a process chamber 12. The raw material gas in the process gas is thermally decomposed in the chamber 12, and a resulting substance is deposited on a semiconductor wafer, thereby forming a silicon oxide film.

A work table 14 on which a semiconductor wafer W is to be placed is located in the process chamber 12. An exhaustion pipe 16 is connected to the process chamber 12 to exhaust the chamber and set the pressure therein to a vacuum value. A heater 18 is provided on the peripheral surface of the process chamber for heating the same.

Tetraethylorthosilicate as the raw material gas is contained in a tank 22 in the form of liquid as a raw material liquid RL. The tank 22 is received in a constant temperature unit 24 and has its internal temperature kept at such a predetermined value as aids the raw material liquid RL to be vaporized. A bubbling nozzle 26 for guiding a carrier gas into the raw material liquid RL is inserted into a deep portion of the raw material liquid in the tank 22. The nozzle 26 is U-shaped, and its open end is directed upward. When the raw material liquid RL has been bubbled by the carrier gas, the raw material gas is created and lead to a space above the liquid RL, and then guided through a delivery line 28 to the outside of the tank 22.

Nitrogen, which is used as the carrier gas, is contained in a source 32 located outside the constant temperature unit 24. A primary line 34 connected to the source 32 is guided into the constant temperature unit 24. A temperature adjusting section 36 is provided on the primary line 34 in the constant temperature unit 24 near the inlet of the same. The carrier gas is heated by the temperature adjusting section 36 to the set temperature of the interior of the unit 24.

A first flow sensor 38, which will be described later, is provided on the primary line 34 on the downstream side of the temperature adjusting section 36. A pressure gauge 37 is connected to that portion of the primary line 34 which is located between the temperature adjusting section 36 and the first flow sensor 38. The primary line 34 branches into a bubbling line 42 and a bypass line 44 at a location downstream of the first flow sensor 38. Electromagnetic valves 46 and 48 are provided on the lines 42 and 44, respectively. The bubbling line 42 extends through an upper wall portion of the tank 22 in an airtight manner, and is connected to the nozzle 26. The bypass line 44 bypasses the tank 22 and is connected along with the delivery line 28 to a supply line 52 for supplying the process gas into the process chamber 12.

The delivery line 28 extends through an upper wall portion of the tank 22 in an airtight manner into the space above the raw material liquid RL, and opens downward in the space such that it does not touch the liquid. The delivery line 28 is connected to the supply line 52 for supplying the process gas into the process chamber 12. A second flow sensor 54, which will be described later, is located on the supply line 52. A pressure gauge 53 is connected to the supply line 52 in the vicinity of the second flow sensor 54. That portion of the supply line 52 which is located between the constant-temperature unit 24 and the process chamber 12 is covered with a heating member 56 such as a heating tape to prevent liquefaction of the raw material gas during transfer.

A flow controller 58 is provided to receive detection signals supplied from the first flow sensor 38 and the pressure gauge 37 located on the primary line 34 for the carrier gas, and also detection signals supplied from the second flow sensor 54 and the pressure gauge 53 located on the supply line 52 for the process gas consisting of the raw material gas and the carrier gas. The opening degrees of the electromagnetic valves 46 and 48 arranged on the bubbling line 42 and the bypass line 44 are controlled by the flow controller 58. As will be explained later, the flow controller 58 measures the flow rate of the raw material gas, compares the measured value of the flow rate with a set reference value of the flow rate of the raw material gas, and adjusts the opening degrees of the electromagnetic valves 46 and 48, on the basis of signals from the flow sensors 38, 54 and the pressure gauges 37 and 53.

A line 64 connected to a raw material liquid-replenishing tank 62 is arranged in the liquid tank 22 such that it reaches a deep portion of the raw material liquid RL. An electromagnetic valve 66 is provided on the line 64 directly under the replenishing tank 62. A liquid level gauge 68 for the raw material liquid RL is provided in the liquid tank 22. The electromagnetic valve 66 and the liquid level gauge 68 are connected to a liquid level controller 72. As will be described later, the liquid level controller 72 detects the liquid level of the raw material liquid RL on the basis of signals from the liquid level gauge 68, and adjusts the opening degree of the electromagnetic valve 66.

Figure 2:
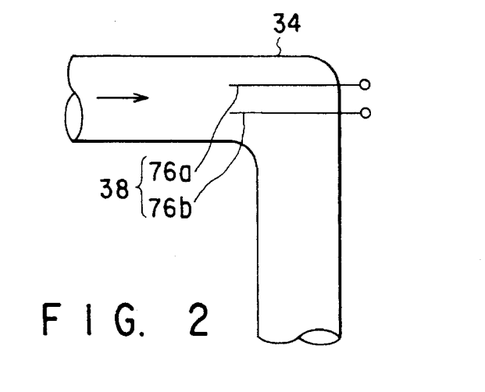
FIG. 2 is a view, showing that portion of the apparatus of FIG. 1 in which a carrier gas flow sensor is located.

As is shown in FIG. 2, the first flow sensor 38 provided on the primary line 34 for the carrier gas has two thermally-sensitive elements 76a and 76b. The element 76a functions as a reference element for detecting an ambient temperature. The other element 76b functions as a heated element for detecting temperature variation caused by the flow of the carrier gas. However, both the elements 76a and 76b have substantially the same structure and are made of substantially the same material.

Figure 3:
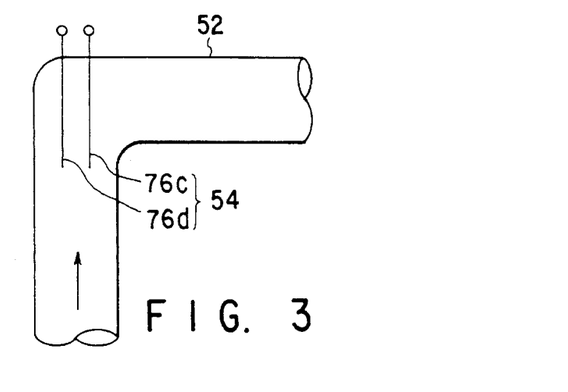
FIG. 3 is a view, showing that portion of the apparatus of FIG. 1 in which a process gas flow sensor is located.

Similarly, as is shown in FIG. 3, the second flow sensor 54 provided on the supply line 52 for the process gas has two thermally-sensitive elements 76c and 76d. The element 76c functions as a reference element for detecting an ambient temperature. The other element 76d functions as a heated element for detecting temperature variation caused by the flow of the process gas. The elements 76c and 76d have substantially the same structure as the elements 76a and 76b and are made of substantially the same material as them.

Figure 7:
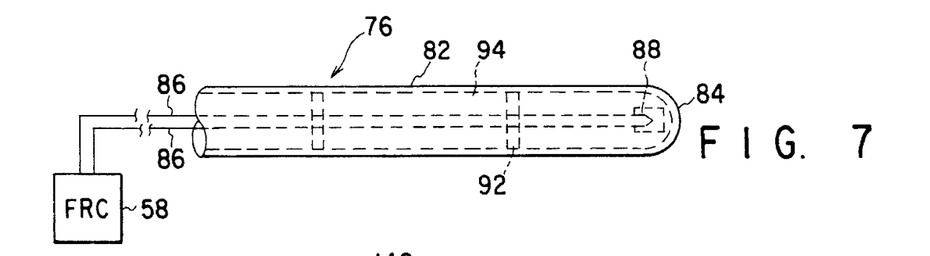
FIG. 7 is a side view, showing a thermally-sensitive element for constituting the flow sensors employed in FIG. 1.

FIG. 7 shows in detail a thermal element 76 to be used as the element 76a, 76b, 76c or 76d. The element 76 has a slim tube 82 inserted in the pipe of the line 34 or 52 in an airtight manner. The tube 82 has an open end 84, a closed end and a mirror-finished surface, and is formed of a metal having a high anti-corrosion and a high thermal conductivity, such as a stainless steel. The tube 82 has a thickness of 0.01 to 1.0 mm and an inner diameter of 1 to 2.5 mm. The portion of the tube 82 which is inserted in the pipe of the line 34 or 52 has a length of 15 mm or more. If that portion of the tube 82 is shorter than 15 mm, it is highly possible that the thermal influence of a substance other than an object to be measured is increased. Therefore, it is preferable to keep that portion of the tube 82 longer than 15 mm.

A platinum resistor wire 86 as a thermally-sensitive, electrically-conductive and self-heating wire, which has superior temperature characteristics and linearity, is provided in the tube 82 such that it extends through the overall length thereof. The wire 86 is folded at an innermost portion of the tube 82, and a platinum resistor plate 88 is welded to the folded end of the wire 86. The wire 86 is supported by a plurality of insulating supporting members 92 provided in the tube 82 at regular intervals. Further, the tube 82 is filled with a heat medium 94 having a superior thermal conductivity, such as silicon grease, for enabling thermal conduct between the tube 82, and the platinum resistor wire 86 and the platinum resistor plate 88. The resistor wire 86 and the resistor plate 88 have temperature-resistance characteristics wherein their resistances vary, for example, by 0.3 to 0.4%/° C. The both opposite ends of the platinum resistor wire 86 are drawn from the opening end of the tube 82 and connected to the flow controller 58.

Preferably, the thermal elements 76a to 76d are inserted in respective bent pipes of the lines 34 and 52 in an airtight manner, as is shown in FIGS. 2 and 3. The tube 82 is located parallel to the direction of the flow of gas, and has its closed end 84 located upstream of the gas flow. The element pair 76a and 76b are located symmetrical to each other with respect to the axis of the pipe of the line 34, and the element pair 76c and 76d are located symmetrical to each other with respect to the axis of the pipe of the line 52.

Figure 5:
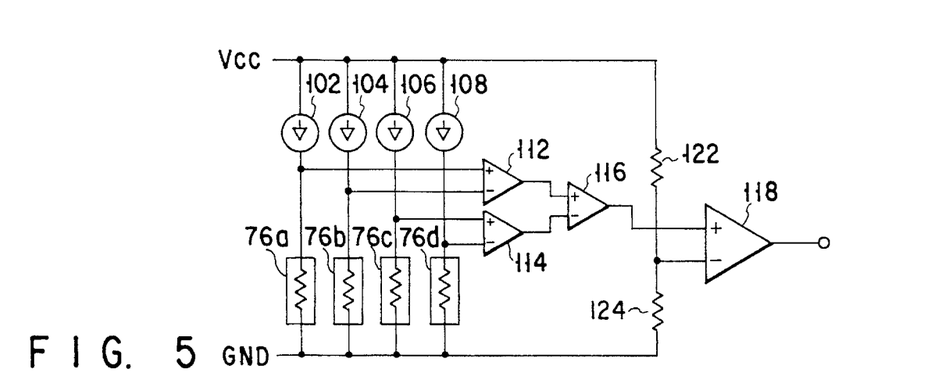
FIG. 5 is a diagram, showing a flow control circuit employed in the apparatus of FIG. 1.

As is shown in FIG. 5, a constant current circuit 102 incorporated in the flow controller 58 is connected to the platinum resistor wire 86 of the reference element 76a of the first flow sensor 38, for supplying the wire with a predetermined small constant current, for example, of 0.1 to 1.0 mA at the time of measurement. The small constant current is set to a value falling within a range in which the platinum resistor wire 86 of the reference element 76a generates substantially no heat. Since the reference element 76a is in a nonheated state in the constant temperature unit 24, it has a temperature substantially the same as the carrier gas flowing through the line 34. On the other hand, a constant current circuit 104 incorporated in the flow controller 58 is connected to the platinum resistor wire 86 of the heated element 76b, for supplying the wire with a predetermined large constant current, for example, of 4.0 to 12.0 mA at the time of measurement. As a result, the resistor wire 86 of the element 76b generates heat and the element 76b is heated.

Since the reference element 76a in the non-heated state has the same temperature as the carrier gas in the line 34, the amount of heat exchanged between the reference element 76a and the carrier gas is always substantially zero irrespective of the flow rate of the carrier gas. In other words, even if the flow rate of the carrier gas varies, the temperature of the reference element 76a does not vary. Thus, the resistance of the platinum resistor wire 86 of the reference element 76a is kept at a value determined by the temperature of the carrier gas flowing through the line 34.

On the other hand, there is a large temperature difference between the heated element 76b and the carrier gas flowing through the line 34. Therefore, when the flow rate of the carrier gas has varied, the amount of heat deprived of from the heated element 76b varies, and accordingly the temperature of the same varies. This means that the amount of heat exchanged between the heated element 76b and the carrier gas varies depending upon the flow rate of the carrier gas.

As is shown in FIG. 5, the output terminals of the constant current circuits 102 and 104 for the thermal elements 76a and 76b are connected to the plus and minus input terminals of a differential circuit 112, respectively. The differential circuit 112 calculates a difference in voltage between the elements 76a and 76b which varies in accordance with variations in the resistances of the platinum resistor wires 86 thereof. The voltage of the resistor wire 86 of the heated element 76b represents the flow rate of the carrier gas on the basis of the temperature of the carrier gas. The reference voltage of the resistor wire 86 of the reference element 76a represents the temperature of the carrier gas. Thus, a signal representing only the flow rate of the carrier gas can be obtained by subtracting the reference voltage of the reference element 76a from the voltage of the heated element 76b.

When the ambient temperature of the first flow sensor 38 has varied, for example, when the temperature of the carrier gas has varied, the reference voltage of the reference element 76a varies accordingly. Thus, the differential circuit 112 can eliminate the influence caused by variations in ambient temperature by subtracting the reference voltage of the reference element 76a from the voltage of the heated element 76b.

Similarly, a constant current circuit 106 incorporated in the flow controller 58 is connected to the resistor wire 86 of the reference element 76c of the second flow sensor 54, for supplying the wire with a predetermined small constant current, for example, of 0.1 to 1.0 mA at the time of measurement. The small constant current is set to a value falling within a range in which the platinum resistor wire 86 of the reference element 76c generates substantially no heat. Since the reference element 76c is in a non-heated state in the constant temperature unit 24, it has a temperature substantially the same as the process gas flowing through the line 52. On the other hand, a constant current circuit 108 incorporated in the flow controller 58 is connected to the platinum resistor wire 86 of the heated element 76d, for supplying the wire with a predetermined large constant current, for example, of 4.0 to 12.0 mA at the time of measurement. As a result, the resistor wire 86 of the element 76d generates heat and the elements 76d is heated.

Since the reference element 76c in the non-heated state has the same temperature as the process gas in the line 52, the amount of heat exchanged between the reference element 76c and the process gas is always substantially zero irrespective of the flow rate of the process gas. In other words, even if the flow rate of the process gas varies, the temperature of the reference element 76c does not vary. Thus, the resistance of the platinum resistor wire 86 of the reference element 76c is kept at a value determined by the temperature of the process gas flowing through the line 52.

On the other hand, there is a large temperature difference between the heated element 76d and the process gas flowing through the line 52. Therefore, when the flow rate of the process gas has varied, the amount of heat deprived of from the heated element 76d varies, and accordingly the temperature of the same varies. This means that the amount of heat exchanged between the heated element 76d and the process gas varies depending upon the flow rate of the process gas.

As is shown in FIG. 5, the output terminals of the constant current circuits 106 and 108 for the thermal elements 76c and 76d are connected to the plus and minus input terminals of a differential circuit 114, respectively. The differential circuit 114 calculates a difference in voltage between the elements 76c and 76d which varies in accordance with variations in the resistances of the platinum resistor wires 86 thereof. The voltage of the resistor wire 86 of the heated element 76d represents the flow rate of the process gas on the basis of the temperature of the process gas. The reference voltage of the resistor wire 86 of the reference element 76c represents the temperature of the process gas. Thus, a signal representing only the flow rate of the process gas can be obtained by subtracting the reference voltage of the reference element 76c from the voltage of the heated element 76d.

When the ambient temperature of the second flow sensor 54 has varied, for example, when the temperature of the process gas has varied, the reference voltage of the reference element 76c varies accordingly. Thus, the differential circuit 114 can eliminate the influence caused by variations in ambient temperature by subtracting the reference voltage of the reference element 76c from the voltage of the heated element 76d.

The output terminals of the differential circuits 112 and 114 are connected to the plus and minus input terminals of a differential circuit 116. The differential circuit 116 calculates the flow rate of the raw material gas from the difference in output voltage between the differential circuits 112 and 114. In other words, the output voltages of the differential circuits 112 and 114 indicate the flow rates of the carrier gas and the process gas, respectively. Accordingly, the difference between the output voltages represents the flow rate of the raw material gas, which is obtained by subtracting the flow rate of the carrier gas from that of the process gas. If, for example, the relationship between the output voltage of the differential circuit 116 and the flow rate of the raw material gas, which is indicated by a calibration curve, is beforehand input in the flow controller 58, the flow rate of the raw material gas can be detected from the output voltage of the differential circuit 116. Further, if the relationships between the output voltages of the differential circuits 112 and 114 and the flow rates of the carrier gas and the process gas, respectively, which are indicated by calibration curves, are beforehand input in the flow controller 58, the flow rates of the carrier gas and the process gas can be detected from the output values of the differential circuits 112 and 114, respectively.

Where it is highly possible that the pressure in the lines 34 and 52 varies significantly, it is desirable to detect the pressure in the lines 34 and 52 with the use of the pressure gauges 37 and 53, respectively, and then to input the detected values in the flow controller 58. The gas flow rates can be detected more accurately by correcting the output voltages of the differential circuits 112 and 114 on the basis of the detected values.

Constant voltage circuits can be used in place of the constant current circuits 102 to 108. In this case, the differential circuits 112 and 114 calculate the difference in current between the reference element 76a and the heated element 76b and that between the reference element 76c and the heated element 76d, respectively. These differences in current vary depending upon variation in the resistance of each platinum resistor wire 86.

The output terminal of the differential circuit 116 is connected to the plus input terminal of a comparator circuit 118. Resistors 122 and 124 are connected to the minus terminal of the comparator circuit 118, for setting a reference value of the flow rate of the raw material gas. At least one of the resistors 122 and 124 consists of a variable resistor which enables the reference value of the flow rate to be changed. The comparator circuit 118 compares the detected flow rate of the raw material gas obtained from the differential circuit 116, with the reference value, and adjusts the opening degree of the electromagnetic valves 46 and 48 provided on the lines 42 and 44 for the carrier gas, on the basis of the comparison result.

To control the flow rate of the raw material gas, the flow controller 58 adjusts the opening degrees of the electromagnetic valves 46 and 48 and changes the ratio (M1/M2) of the flow M1 of a first part of the carrier gas passing through the bubbling line 42 to the flow M2 of a second part of the carrier gas passing through the bypass line 44. Here, control may be performed so as to keep (M1+M2) at a constant value, or so as to keep constant the flow rate of the process gas detected by the flow sensor 54. Such control facilitates the control of process conditions such as the pressure and temperature in the process chamber.

A method for changing a factor such as the flow rate of the overall carrier gas, the temperature of the liquid tank 22 or the level of the raw material liquid RL can be employed as another method for controlling the flow rate of the raw material gas. However, changing the flow rate of the overall carrier gas may greatly change the pressure in the process chamber. Changing the temperature of the tank 22 may reduce the response speed in the control since it requires a relatively long time, or cause an erroneous operation of the flow sensor 38 or 54. Changing the level of the raw material liquid RL may reduce the response speed in the control since it requires a relatively long time, or may make it difficult to accurately perform the control.

Figure 6:
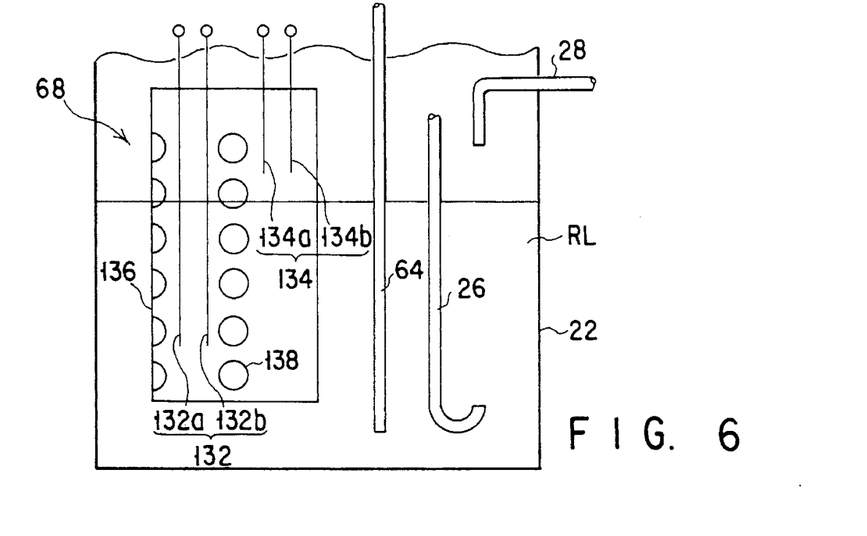
FIG. 6 is a view, showing a raw material liquid tank employed in the apparatus of FIG. 1.

As is shown in FIG. 6, the liquid level gauge 68 provided in the liquid tank 22 has a lower limit sensor 132 and an upper limit sensor 134. These sensors 132 and 134 are contained in a cylinder 136 having opening at its lower and upper ends. A plurality of holes 138 are formed in a portion thereof which does not face the carrier gas nozzle 26, for preventing the carrier gas from the nozzle 26, from adversely affecting the sensors 132 and 134.

The lower limit sensor 132 has thermally-sensitive elements 132a and 132b, and the upper limit sensor 134 has thermally-sensitive elements 134a and 134b. The thermally-sensitive elements 132a and 134a of the sensots 132 and 134 function as reference elements for detecting the ambient temperature, while the thermally-sensitive elements 132b and 134b function as heated elements for detecting variations in temperature due to variations in liquid level. The elements 132a, 132b, 134a and 134b are made of substantially the same material and have substantially the same structure as those shown in FIG. 7, except for the length thereof. Therefore, no detailed explanation is given thereof.

The platinum resistor wires 86 of the reference elements 132a and 134a are supplied with a predetermined small constant current, for example, of 0.1 to 1.0 mA from a constant current circuit (not shown). The small constant current is set to a value falling within a range in which the platinum resistor wires 86 of the reference elements 132a and 132b generate substantially no heat. On the other hand, the platinum resistor wires 86 of the heated elements 132b and 134b generate heat and the elements 132b and 134b are supplied with a predetermined large constant current, for example, of 4.0 to 12.0 mA from a constant current circuit (not shown). As a result, the resistor wires 86 of the elements 132b and 134b generate heat and the elements 132b and 134b are heated. Like the flow sensors 38 and 54 explained with reference to FIG. 5, each of the sensors 132 and 134 is connected to a differential circuit (not shown), which enables the calculation of the difference in voltage between the reference element 132a and the heated element 132b and that between the reference element 134a and the heated element 134b.

The lower end of each of the thermal elements 132a and 12b of the lower limit sensor 132 is located at a level (i.e., a lower limit level) higher than the level of the open end of the nozzle 26. when the raw material liquid RL has been reduced and its level has become lower than the lower ends of the elements 132a and 132b, the thermal capacity of substances which contact the elements significantly varies. Accordingly, the temperature of the heated element 132b varies, so that there is provided information indicating that the level of the liquid has become lower than the lower limit level. The liquid level controller 72 opens the electromagnetic valve 66 on the basis of the information, causing the replenishing tank 62 to replenish the tank 22 with the raw material liquid.

The lower end each of the thermal elements 134a and 134b of the upper limit sensor 134 is located at a level (i.e., an upper limit level) lower than the level of the open end of the delivery line 28. When the raw material liquid RL has been replenished and its level has become higher than the upper ends of the elements 134a and 134b, the thermal capacity of substances which contact the elements significantly varies. Accordingly, the temperature of the heated element 134b varies, so that there is provided information indicating that the level of the liquid has become higher than the upper limit level. The liquid surface controller closes the electromagnetic valve 66 on the basis of the information, ceasing the supply of the raw material liquid from the replenishing tank 62 to the tank 22.

The operation of the CVD apparatus shown in FIG. 1 will now be explained, referring to the case of forming a silicon oxide film on a semiconductor wafer.

First, the relationship between the output voltage of the differential circuit 116 and the flow rate of the raw material gas, which is indicated by a calibration curve, is input to the flow controller 58. Further, if necessary, the relationships between the output voltages of the differential circuits 112 and 114 and the flow rates of the carrier gas and the gas, respectively, which are indicated by calibration curves, are also input to the flow controller 58. Moreover, a reference value for the flow rate of the raw material gas is selected and input to the controller 58.

The raw material gas such as Tetraethylorthosilicate is contained in the tank 22 in the form of liquid and supplied from the replenishing tank 62 to the tank 22. The interior of the constant temperature unit 24 containing the tank 22 is kept at a predetermined temperature, for example, of 60° C. to facilitate the vaporization of the raw material liquid RL.

A semiconductor wafer W to be treated is placed onto a work table 14 in the process chamber 12. Then, the process chamber 12 is exhausted in an airtight state, thereby setting the interior of the chamber under vacuum pressure, for example, of 2 Tort. Further, the wafer W in the chamber 12 is heated to a predetermined temperature, for example, of 650° C.

The carrier gas is discharged from the source 32 to the line 34 with a predetermined flow rate of e.g. 7.5 i/min. A first part of the carrier gas is supplied to the liquid tank 22 through the line 42 and the nozzle 26. The first part of the carrier gas bubbles the raw material liquid RL to derive the raw material gas therefrom with a flow rate of e.g. 100 sccm. The first part of the carrier gas and the raw material gas are introduced into the supply line 52 through the delivery line 28. The remaining second part of the carrier gas is introduced into the supply line 52 through the bypass line 44. The thus obtained process gas consisting of the carrier gas and the raw material gas are supplied to the process chamber 12 through the supply line 52.

Tetraethylorthosilicate as the raw material gas is thermally decomposed in the process chamber 12, and part of resultant substances is deposited on the semiconductor wafer to form a silicon oxide film. Gaseous substances including the carrier gas, which are not the component of the silicon oxide film, are exhausted from the process chamber 12.

During forming the film, the flow controller 58 compares the flow rate of the raw material gas calculated using the flow sensors 38 and 54, with the reference value, and adjusts the opening degrees of the electromagnetic valves 42 and 44 on the basis of the differences therebetween. The control of the flow rate of the raw material gas by the flow controller 58 is performed by changing the ratio of the flow rate of the first part of the carrier gas passing through the bubbling line 42, to that of the second part of the carrier gas passing through the bypass line 44.

During forming the silicon oxide film, the level of the raw material liquid RL in the tank 22 is monitored by the liquid level gauge 68. The liquid level controller 72 adjusts the opening degree of the electromagnetic valve 66 on the basis of a signal from the gauge 68, and maintains the level of the liquid RL within a range set by the lower and upper limit sensors 132 and 134.

Figure 4:
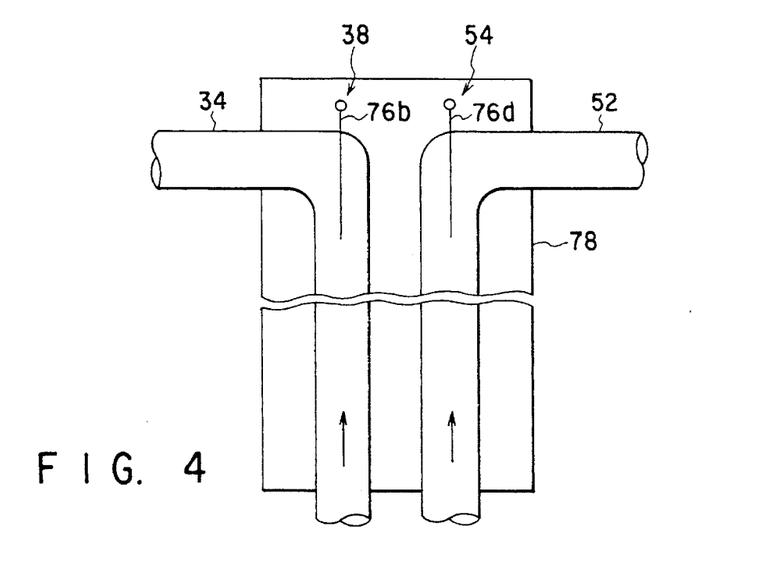
FIG. 4 is a view, showing modifications of the flow sensors.

FIG. 4 shows modifications of the flow sensors 38 and 54. In the modifications, the flow sensors 38 and 54 have only the heated elements 76b and 76d, respectively, and no reference elements 76a and 76c. Those portions of the lines 34 and 52 at which the flow sensors 38 and 54 are provided are located adjacent to each other. The sensors 38 and 54 are arranged in a common temperature adjustment section 78. The section 78 forcibly maintains these portions of lines 34 and 52 containing the flow sensors 38 and 54 at a constant temperature. The portions of the lines 34 and 52 which are located in the section 78 are long enough on the upstream sides of the flow sensors 38 and 54, respectively, so that the gas flowing through each of the lines 34 and 52 can be set at the constant temperature.

As a result, the flow sensors 38 and 54 according to the modification shown in FIG. 4 own a common and constant ambient temperature as the reference temperature. This being so, the reference elements 76a and 76c required in the structure shown in FIGS. 2 and 3 are not necessary. Further, the differential circuits 112 and 114 shown in FIG. 5, required to calculate the differences in voltage between the reference elements 76a and 76c and the heated elements 76b and 76d, are also not necessary. In this case, instead of using the circuits 112 and 114, the heated elements 76b and 76d are directly connected to the input terminals of the differential circuit 116.

Figure 8:
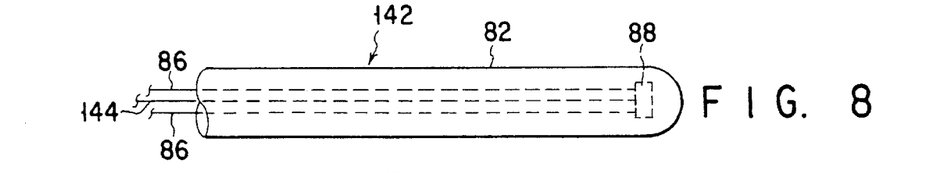
FIGS. 8 to 10 are side views, showing modifications of the thermally-sensitive element.
Figure 9:
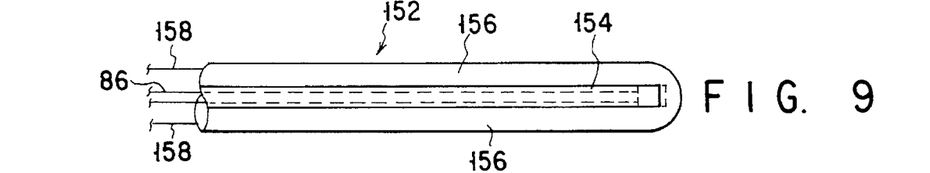
Figure 10:
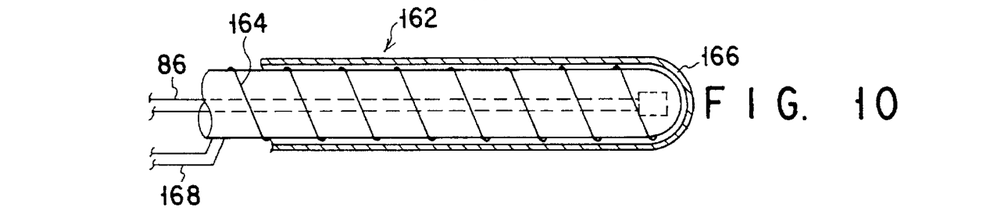

FIGS. 8 to 10 show modifications of the thermal element 76 used as the heated element. In these modifications, a member serving only as a heater is used as well as the platinum resistor wire 86 as a thermallysensitive body. Although these modifications inevitably have complicated structures, they are advantageous in that only a small amount of current is necessary for the platinum resistor wire 86, and a higher sensitivity to heat can be attained.

A thermal element 142 shown in FIG. 8 is obtained by providing in the tube 82 shown in FIG. 7 a resistance heating wire 144 serving as a heater along with the platinum resistor wire 86. One of the twofold portions of the resistor wire 86 is used as a common line to supply voltage to the resistance heating wire 144.

A thermal element 152 shown in FIG. 9 has a covering tube which consists of a pair of resistance heating parts 156 adhered to each other with an insulating layer 154 interposed therebetween. The resistance heating parts 156 are directly connected to each other only at the closed end of the tube, and power supply wires 158 are connected to the parts 156 at the open end of the tube. In other words, the tube itself serves as a heater.

A thermal element 162 shown in FIG. 10 is obtained by winding a heating coil 164 on the tube 82 shown in FIG. 7 and containing the tube 82 with the heating coil 164 in a tube 166 made of a metal having a high corrosion resistance and a high heat conductivity, such as stainless steel. The power supply wires 168 of the coil 164 are drawn from the open end of the tube 166.

Although the CVD apparatus is used in the embodiment, the invention is not limited to this apparatus, but also applicable to a thermal treatment apparatus, a diffusion apparatus, an etching apparatus, etc., which have a raw material gas supply system.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An apparatus for treating a substrate while supplying a process chamber with a process gas including first and second gases, comprising:

the process chamber;

a support member arranged in the process chamber for supporting the substrate;

a supply line for supplying the process gas into the process chamber;

a tank for containing a raw material liquid, from which the second gas is derived, and having a vapor space defined therein above the raw material liquid, the supply line being connected to the tank such that it communicates with the vapor space;

a primary line for supplying the first gas to the supply line, at least part of the first gas being passed through the raw material liquid in the tank in the form of bubble, thereby to derive the second gas from the raw material liquid and send the second gas to the supply line through the vapor space;

a first flow sensor provided on the primary line and comprising a first heated element, the first heated element having a thermally-sensitive and electrically conductive wire, whose resistance varies in accordance with a variation in temperature;

a second flow sensor provided on the supply line and comprising a second heated element, the second heated element having a thermally-sensitive and electrically conductive wire, whose resistance varies in accordance with a variation in temperature; and a flow controller connected to the first and second flow sensors for controlling a flow rate of the second gas contained in the process gas, the flow controller generating a first electric signal representing a flow rate of the first gas on the basis of a variation in the resistance of the thermally-sensitive and electrically conductive wire of the first heated element, also generating a second electric signal representing a flow rate of the process gas on the basis of a variation in the resistance of the thermally-sensitive and electrically conductive wire of the second heated element, and calculating a measured value of the flow rate of the second gas on the basis of the difference between the first and second electric signals;

wherein the thermally-sensitive and electrically conductive wire of each of the first and second heated elements consists of a self-heating body which generates heat by a voltage supplied thereto; and wherein each of the first and second heated elements further comprises a thermally conductive tube enclosing the thermally-sensitive and electrically conductive wire, the tube being filled with a thermally conductive and an electrically insulating substance, and having an outer surface exposed to a gas to be measured.

2. The apparatus according to claim 1, wherein each of the first and second heated elements comprises a resistance heating body different from the thermally-sensitive and electrically conductive wire.

3. The apparatus according to claim 1, further comprising first and second pressure gauges provided on the primary line and the supply line, respectively, and connected to the flow controller, wherein influence of pressure variations in the primary line and the supply line on the first and second signals is compensated on the basis of detected values from the first and second pressure gauges.

4. The apparatus according to claim 1, further comprising a constant temperature unit housing the tank and portions of the primary line and the supply line on which the first and second flow sensors are provided, for setting them at substantially the same temperature.

5. The apparatus according to claim 4, further comprising a temperature adjusting section provided on the primary line on the upstream side of the first flow sensor, for setting the first gas to the temperature of the constant temperature unit.

6. The apparatus according to claim 1, wherein the first and second flow sensors further comprise first and second reference elements, which are in a non-heated state, for detecting ambient temperatures, each of the first and second reference elements having a thermally-sensitive and electrically conductive wire, whose resistance varies in accordance with a variation in temperature, and wherein the flow controller derives the first signal from the difference between two electric signals obtained on the basis of the resistances of the thermally-sensitive and electrically conductive wires of the first heated element and the first reference element, and also derives the second signal from the difference between two electric signals obtained on the basis of the resistances of the thermally-sensitive and electrically conductive wires of the second heated element and the second reference element.

7. The apparatus according to claim 1, wherein portions of the primary line and the supply line on which the first and second flow sensor are provided are haused in a common temperature adjusting section and kept at a constant temperature.

8. The apparatus according to claim 1, wherein the apparatus is a CVD apparatus, the first gas is a carrier gas, and the second gas is a raw material gas for providing a material of a film formed by CVD.

9. An apparatus for treating a substrate while supplying a process chamber with a process gas including first and second gases, comprising:

the process chamber;

a support member arranged in the process chamber for supporting the substrate;

a supply line for supplying the process gas into the process chamber;

a delivery line for sending a first part of the first gas and the second gas to the supply line;

a bypass line for sending a second part of the first gas to the supply line;

a tank for containing a raw material liquid, from which the second gas is derived, and having a vapor space defined therein above the raw material liquid, the delivery line being connected to the tank such that it communicates with the vapor space;

a bubbling line for sending the first part of the first gas into the raw material liquid in the tank, the first part of the first gas being passed through the raw material liquid in the form of bubbles, thereby to derive the second gas from the raw material liquid and send the second gas to the delivery line through the vapor space;

first and second electromagnetic valves provided on the bubbling line and the bypass line, respectively;

a primary line for supplying the first and second parts of the first gas to the bubbling line and the bypass line, respectively;

a first flow sensor provided on the primary line and comprising a first heated element, the first heated element having a thermally-sensitive and electrically conductive wire, whose resistance varies in accordance with a variation in temperature;

a second flow sensor provided on the supply line comprising a second heated element, the second heated element having a thermally-sensitive and electrically conductive wire, whose resistance varies in accordance with a variation in temperature; and a flow controller, connected to the first and second flow sensors and the first and second electromagnetic valves, for controlling a flow rate of the second gas contained in the process gas, the flow controller generating a first electric signal representing a flow rate of the first gas on the basis of a variation in the resistance of the thermally-sensitive and electrically conductive wire of the first heated element, also generating a second electric signal representing a flow rate of the process gas on the basis of a variation in the resistance of the thermally-sensitive and electrically conductive wire of the second heated element, calculating a measured value of the flow rate of the second gas on the basis of the difference between the first and second electric signals, comparing the measured value with a preset reference value, and adjusting the opening degrees of the first and second electromagnetic valves to change the ratio of the first part of the first gas to the second part of the same on the basis of the comparison.

10. The apparatus according to claim 9 wherein the thermally-sensitive and electrically conductive wire of each of the first and second heated elements consists of a self-heating body which generates heat by a voltage supplied thereto.

11. The apparatus according to claim 10, wherein each of the first and second heated elements further comprises a thermally conductive tube enclosing the thermally-sensitive and electrically conductive wire, the tube being filled with a thermally conductive and an electrically insulating substance, and having an outer surface exposed to a gas to be measured.

12. The apparatus according to claim 9, wherein each of the first and second heated elements comprises a resistance heating body different from the thermally-sensitive and electrically conductive wire.

13. The apparatus according to claim 9, further comprising first and second pressure gauges provided on the primary line and the supply line, respectively, and connected to the flow controller, wherein influence of pressure variations in the primary line and the supply line on the first and second signals is compensated on the basis of detected values from the first and second pressure gauges.

14. The apparatus according to claim 9, further comprising a constant temperature unit housing the tank and portions of the primary line and the supply line on which the first and second flow sensors are provided, for setting them at substantially the same temperature.

15. The apparatus according to claim 14, further comprising a temperature adjusting section provided on the primary line on the upstream side of the first flow sensor, for setting the first gas to the temperature of the constant temperature unit.

16. The apparatus according to claim 9, wherein the first and second flow sensors further comprise first and second reference elements, which are in a non-heated state, for detecting ambient temperatures, each of the first and second reference elements having a thermally-sensitive and electrically conductive wire, whose resistance varies in accordance with a variation in temperature, and wherein the flow controller derives the first signal from the difference between two electric signals obtained on the basis of the resistances of the thermally-sensitive and electrically conductive wires of the first heated element and the first reference element, and also derives the second signal from the difference between two electric signals obtained on the basis of the resistances of the thermally-sensitive and electrically conductive wires of the second heated element and the second reference element.

17. The apparatus according to claim 9, wherein portions of the primary line and the supply line on which the first and second flow sensor are provided are housed in a common temperature adjusting section and kept at a constant temperature.

18. The apparatus according to claim 9, wherein the apparatus is a CVD apparatus, the first gas is a carrier gas, and the second gas is a raw material gas for providing a material of a film formed by CVD.

* * * * *